United States Patent
Hui et al.

(10) Patent No.: US 6,506,683 B1
(45) Date of Patent: Jan. 14, 2003

(54) IN-SITU PROCESS FOR FABRICATING A SEMICONDUCTOR DEVICE WITH INTEGRAL REMOVAL OF ANTIREFLECTION AND ETCH STOP LAYERS

(75) Inventors: Angela T. Hui, Fremont, CA (US); Yongzhong Hu, San Jose, CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/413,621

(22) Filed: Oct. 6, 1999

(51) Int. Cl.[7] .............................................. H01L 21/302
(52) U.S. Cl. ....................... 438/706; 438/724; 438/725; 438/733
(58) Field of Search ................... 438/710, 723, 438/724, 733

(56) References Cited

U.S. PATENT DOCUMENTS

| | | | |
|---|---|---|---|
| 5,635,423 A | * 6/1997 | Huang et al. | 437/195 |
| 6,008,120 A | * 12/1999 | Lee | 438/634 |
| 6,040,619 A | * 3/2000 | Wang et al. | 257/649 |
| 6,127,070 A | * 10/2000 | Yang et al. | 430/5 |

* cited by examiner

Primary Examiner—Benjamin L. Utech
Assistant Examiner—Charlotte A. Brown

(74) Attorney, Agent, or Firm—Wagner Murabito & Hao LLP

(57) ABSTRACT

A semiconductor memory device such as a flash Electrically Erasable Programmable Read-Only Memory (Flash EEPROM) is fabricated by performing a number of process steps in-situ. Semiconductor devices having local interconnect areas are formed on a surface of a semiconductor substrate. An etch stop layer is formed over the surface of the substrate and the devices, and an inter level dielectric layer (ILD) is formed over the etch stop layer. An antireflection layer (ARC) is formed over the insulator layer, and a photoresist layer is formed over the insulator layer. The photoresist layer is photolithographically patterned to form first holes therethrough which overlie the interconnect areas. Using the patterned photoresist layer as a mask, second holes which underlie the first holes are etched using Reactive Ion Etching (RIE) through the antireflection layer to the insulator layer. Third holes are etched through the insulator layer down to the etch stop layer. The photoresist layer is removed, and the antireflection layer and portions of the etch stop layer which underlie the third holes are simultaneously removed to form fourth holes through the etch stop layer without adversely affecting the insulator layer and/or the interconnect areas. The third and fourth holes are then filled ex-situ with electrically conductive tungsten which ohmically contacts the interconnect areas to form local interconnects. The simultaneous removal of the antireflection layer and the portions of the etch stop layer eliminate several conventional processing steps and enable much of the processing to be performed in-situ.

5 Claims, 17 Drawing Sheets

IN-SITU PROCESS FOR FABRICATING A SEMICONDUCTOR DEVICE WITH INTEGRAL REMOVAL OF ANTIREFLECTION AND ETCH STOP LAYERS

BACKGROUND OF THE INVENTION

1. Field of the Invention

The present invention generally relates to the art of microelectronic integrated circuits, and more specifically to an in-situ process for fabricating a semiconductor device with integral removal of antireflection and etch stop layers which are separated by an insulator layer.

2. Description of the Related Art

Although the present invention can be applied to the fabrication of a variety of semiconductor devices, a particularly suitable application of the invention relates to the fabrication of a flash or block erase Electrically Erasable Programmable Read-Only Memory (Flash EEPROM) semiconductor memory which includes an array of cells which can be independently programmed and read. The size of each cell and thereby the memory are made small by omitting select transistors which would enable the cells to be erased independently. All of the cells are erased together as a block.

A memory of this type includes individual Metal-Oxide-Semiconductor (MOS) memory cells, each of which includes a source, drain, floating gate and control gate to which various voltages are applied to program the cell with a binary 1 or 0, or erase all of the cells as a block.

Tungsten damascene is a process for fabricating local interconnects which can be advantageously applied to semiconductor devices including flash EEPROMs. The process includes forming an inter level dielectric insulator layer (ILD) of, for example, tetraethylorthosilicate (TEOS) glass over the memory cells, and using Reactive Ion Etching (RIE) to form vertical interconnect holes through the glass down to interconnect areas (source, drain, etc.) of the cells. The holes are filled with tungsten which ohmically contacts the interconnect areas to form the local interconnects.

The TEOS etch is conventionally performed using octafluorobutene ($C_4F_8$) etchant, which also has a high etch rate for silicon. For this reason, a mechanism must be provided for performing the TEOS etch without allowing the etchant to act on the silicon of the underlying interconnect areas.

Such a mechanism includes forming an etch stop layer underneath the TEOS layer, and performing the etch in two stages. The first stage is the octafluorobutene etch through the TEOS layer, which terminates at the etch stop layer since octafluorobutene has a low etch rate for etch stop layer. Suitable materials for the etch stop layer include silicon nitride ($Si_3N_4$) and silicon oxynitride (SiON:H).

Then, a second RIE etch is performed using fluoromethane ($CH_3F$), which forms holes through the portions of the etch stop layer that are exposed through the holes in the TEOS layer, down to the interconnect areas of the devices. This is possible because fluoromethane has a high etch rate for silicon nitride, but a low etch rate for TEOS.

The structure can be further facilitated by using a silicide technique to increase the conductivity of the interconnect areas of the cells. Siliciding is a fabrication technique that enables electrical interconnections to be made that have reduced resistance.

The silicide process comprises forming a layer of a refractory metal silicide material such as cobalt, tungsten, titanium, tantalum, molybdenum, etc. on a silicon interconnect area (source or drain diffusion region) or on a polysilicon gate to which ohmic contact is to be made, and then reacting the silicide material with the underlaying silicon material to form a silicide surface layer having much lower resistance than heavily doped silicon or polysilicon. A silicide surface layer formed on a polysilicon gate is called "polycidel", whereas a silicide surface layer formed on silicon using a self-aligned process is called "salicide".

The holes are precisely formed using photolithography. More specifically, a layer of photoresist is formed over the insulator layer, and exposed to light through a mask which has opaque and transparent areas corresponding to the desired pattern. Light passing through the transparent areas in the mask causes a chemical reaction in the underlying areas of the photoresist such that these areas will be dissolved away when the wafer is exposed to a developing solution.

The result is a photoresist layer having openings therethrough which correspond to the transparent areas of the mask. The patterned photoresist layer is then used as an etch mask such that areas of the insulator layer which are exposed by the openings in the photoresist layer will be selectively removed upon exposure to an appropriate etchant.

With feature sizes of integrated circuits constantly shrinking, photolithographic resolution or definition is becoming increasingly sensitive to reflection during the light exposure step. For this reason, an antireflective coating or layer is preferably provided between the insulator layer and the photoresist layer. Suitable materials for the antireflection layer are silicon oxynitride (SiON:H) and silicon oxime (SiNO:H).

As described above, it is necessary to remove the portions of the etch stop layer overlying the interconnect areas so that ohmic contact can be made between the silicide and the tungsten which fills the holes. In fabricating EEPROMs and certain other devices, it is also necessary to remove the antireflection layer.

This is conventionally done using ex-situ processing involving a number of steps and separate apparatus. First, the etch stop layer overlying the interconnect areas is removed using RIE. Then, the wafer is removed from the RIE chamber, and the photoresist is removed by conventional ashing. Tungsten is formed in the holes to ohmically contact the silicide in the interconnect areas. A chemical-mechanical polishing (CMP) step is performed to remove any tungsten which overlies the antireflection layer. Finally, an oxide buff, which is also a CMP process, is performed to remove the antireflection layer and planarize the upper surface of the structure.

The prior art method of performing these steps is disadvantageous in that it must be performed ex-situ using several types of apparatus, and also in that certain of the steps have undesirable side effects. A notable example is that the oxide buff step for removing the antireflection layer creates non-uniformities in the surface of the underlying insulator layer which must be dealt with in subsequent processing steps.

SUMMARY OF THE INVENTION

The present invention overcomes the drawbacks of the prior art by eliminating several process steps and enabling a substantial amount of the fabrication processing to be performed in-situ.

More specifically, a semiconductor memory device such as a flash Electrically Erasable Programmable Read-Only Memory (Flash EEPROM) is fabricated by performing a number of process steps in-situ. Semiconductor devices having local interconnect areas are formed on a surface of a semiconductor substrate. An etch stop layer is formed over the surface of the substrate and the devices, and an inter level dielectric layer (ILD) is formed over the etch stop layer. An antireflection layer (ARC) is formed over the insulator layer, and a photoresist layer is formed over the insulator layer.

The photoresist layer is photolithographically patterned to form first holes therethrough which overlie the interconnect areas. Using the patterned photoresist layer as a mask, second holes which underlie the first holes are etched using Reactive Ion Etching (RIE) through the antireflection layer to the insulator layer. Third holes are etched through the insulator layer down to the etch stop layer.

The photoresist layer is removed, and the antireflection layer and portions of the etch stop layer which underlie the third holes are simultaneously removed to form fourth holes through the etch stop layer without adversely affecting the insulator layer and/or the interconnect areas. The third and fourth holes are then filled ex-situ with electrically conductive tungsten which ohmically contacts the interconnect areas to form the local interconnects.

The simultaneous removal of the antireflection layer and the portions of the etch stop layer eliminate several conventional processing steps and enable much of the processing to be performed in-situ.

These and other features and advantages of the present invention will be apparent to those skilled in the art from the following detailed description, taken together with the accompanying drawings, in which like reference numerals refer to like parts.

DETAILED DESCRIPTION OF THE INVENTION

FIGS. 1 to 8 are simplified sectional diagrams illustrating a portion of a process for fabricating a flash EEPROM semiconductor memory device which is common to the prior art and the present invention. The detailed configuration of the device is not the particular subject matter of the invention, and only those elements which are necessary for understanding the invention will be described and illustrated. It will be noted that the invention is not limited to the fabrication of EEPROMs, but is applicable to the fabrication of various other types of semiconductor devices.

Figure 1:
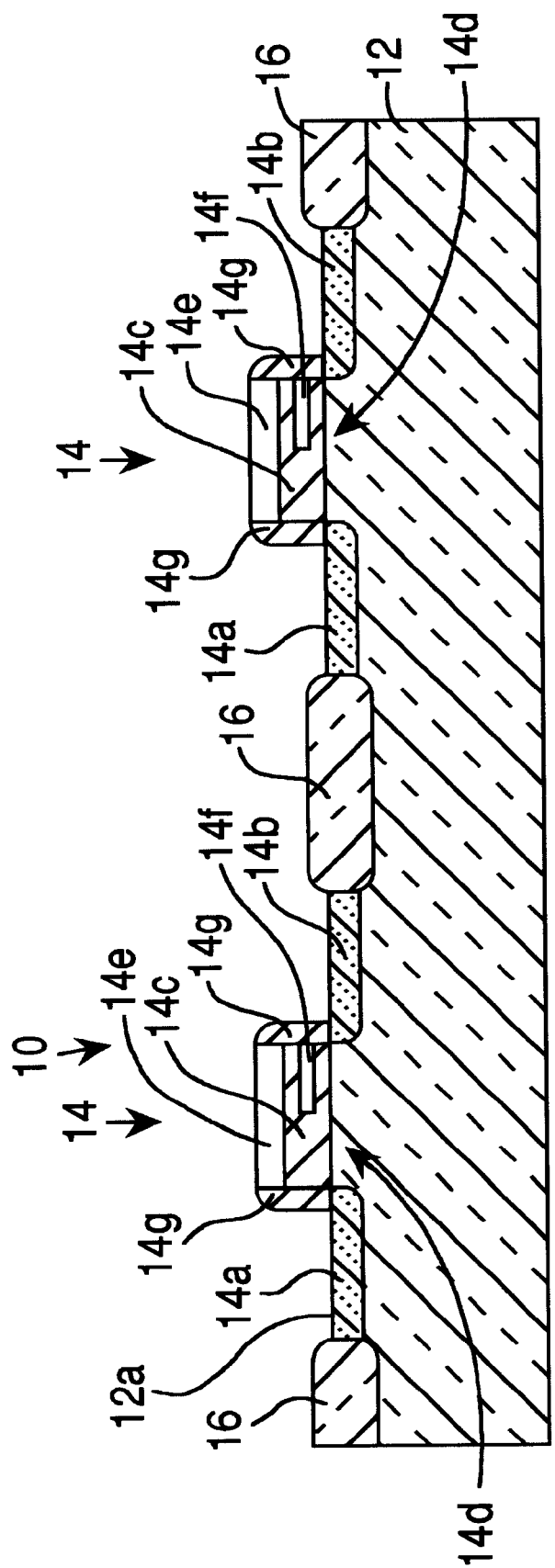
FIGS. 1 to 8 are simplified sectional views illustrating steps of a process for fabricating a semiconductor device in the present invention.

As viewed in FIG. 1, a flash EEPROM memory 10 includes a silicon semiconductor substrate 12. Two erasable memory cells 14 are formed on a surface 12a of the substrate 12, each including a MOS transistor structure having a source 14a, drain 14b, gate oxide layer 14c, and channel 14d underlying the gate oxide layer 14c. The cells 14 are physically and electrically isolated from each other by field oxide regions 16.

A polysilicon control gate 14e is formed over each gate oxide layer 14c, and a polysilicon floating gate 14f is formed underneath the control gate 14e in the gate oxide layer 14c.

Although the gate oxide layers 14c are shown as being integral, they may comprise two or more sublayers. For example, portions of the gate oxide layers 14c which underlie the floating gates 14f may be separate tunnel oxide layers. Further shown in the drawing are electrically insulating gate sidewall spacers 14g.

The construction and operation of the memory 10 are not the particular subject matter of the invention and will not be described in detail. Furthermore, the reference numerals designating the individual elements of the memory cells 14 will be omitted in FIGS. 2 to 17 except as required for understanding the invention to avoid cluttering of the drawings.

FIG. 1 illustrates the initial steps of the present process, which consist of providing the substrate 12, and forming semiconductor devices such as the erasable memory cells 14 on the surface 12a of the substrate 12.

Figure 2:
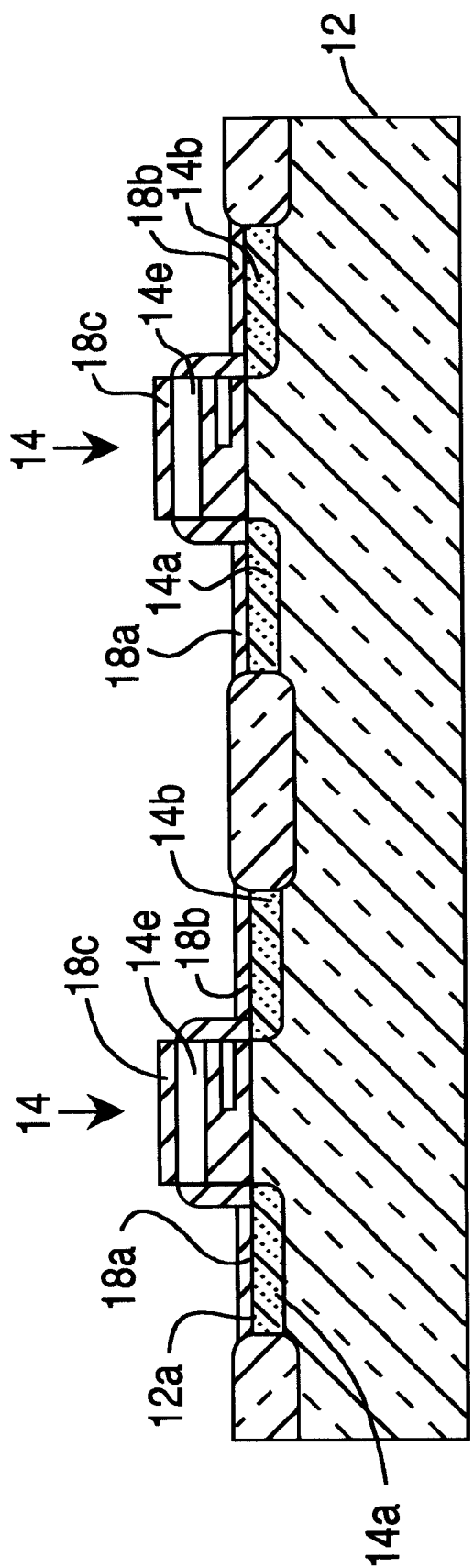

FIG. 2 shows how interconnect areas are formed for the elements of the cells using a salicide technique to increase the electrical conductivity. The process comprises forming a layer of a refractory metal material such as cobalt, tungsten, titanium, tantalum, molybdenum, etc. on the source, 14a, drain 14b, and control gate 14e to which ohmic contact is to be made, and then reacting the metal with the underlaying silicon material to form silicide source interconnect areas 18a, drain interconnect areas 18b, and control gate interconnect areas 18c respectively.

Figure 3:
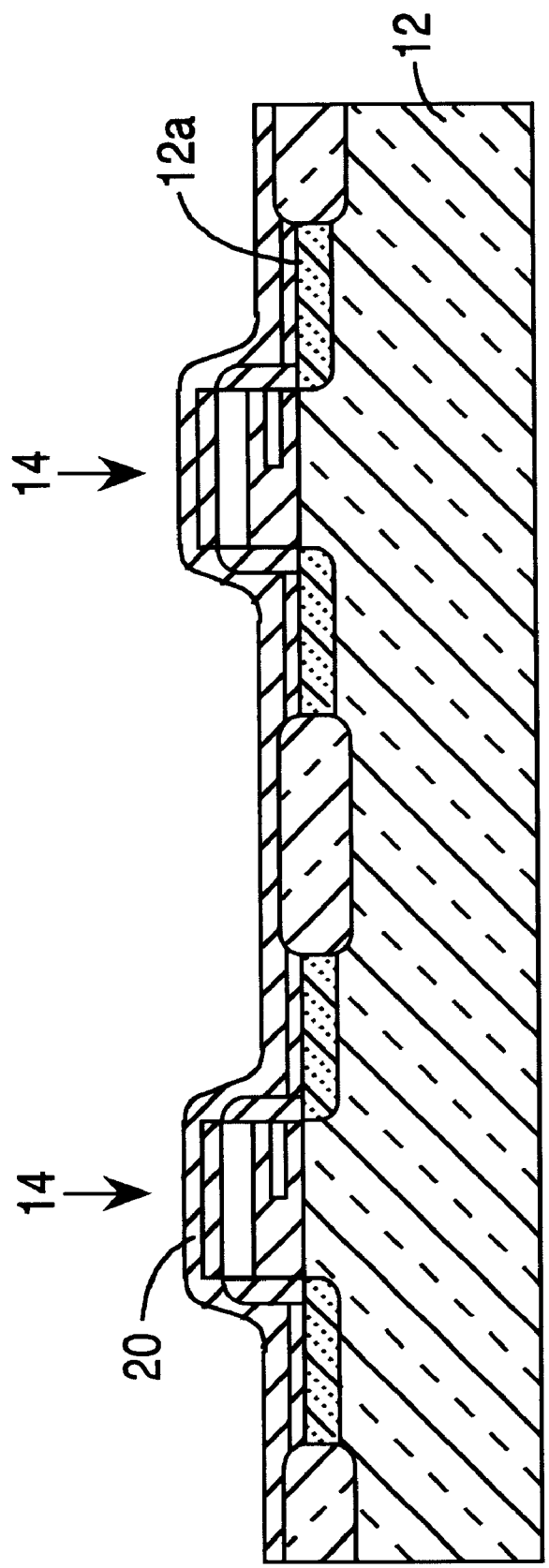

FIG. 3 illustrates how an etch stop layer 20 is formed over the surface 12a of the substrate 12 and the devices 14 in accordance with the present invention. The etch stop layer 20 is preferably formed using Plasma Enhanced Chemical Vapor Deposition (PECVD). The etch stop layer 20 can be formed of any suitable material, including, but not limited to, silicon nitride ($Si_3N_4$) and silicon oxynitride (SiON:H).

Figure 4:
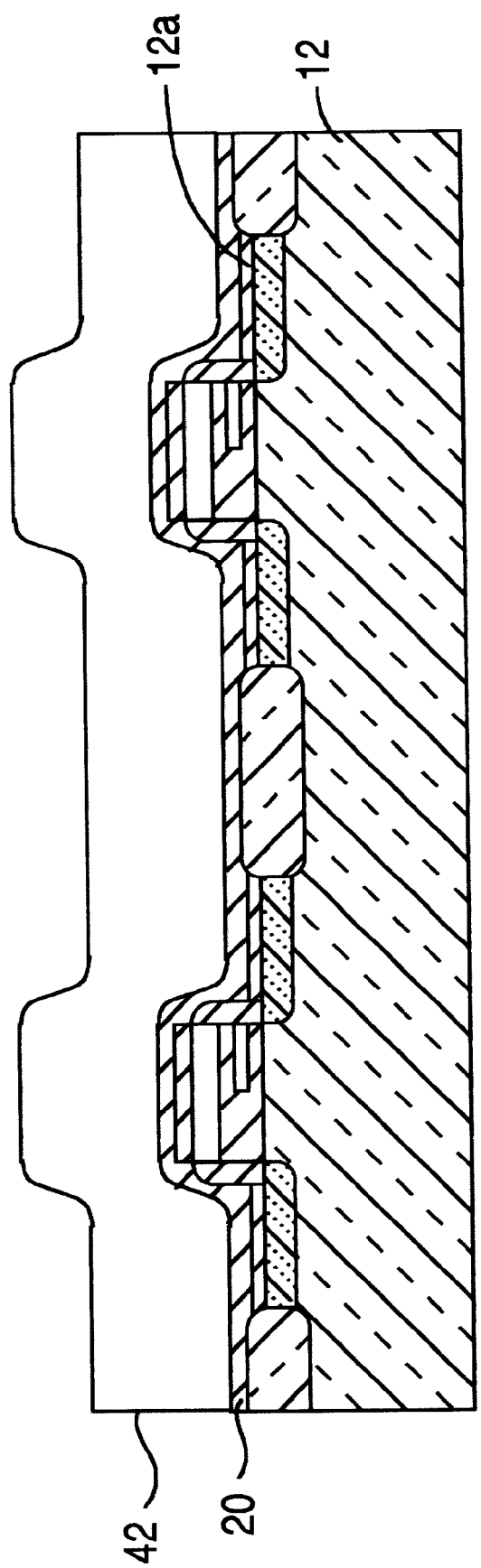
Figure 5:
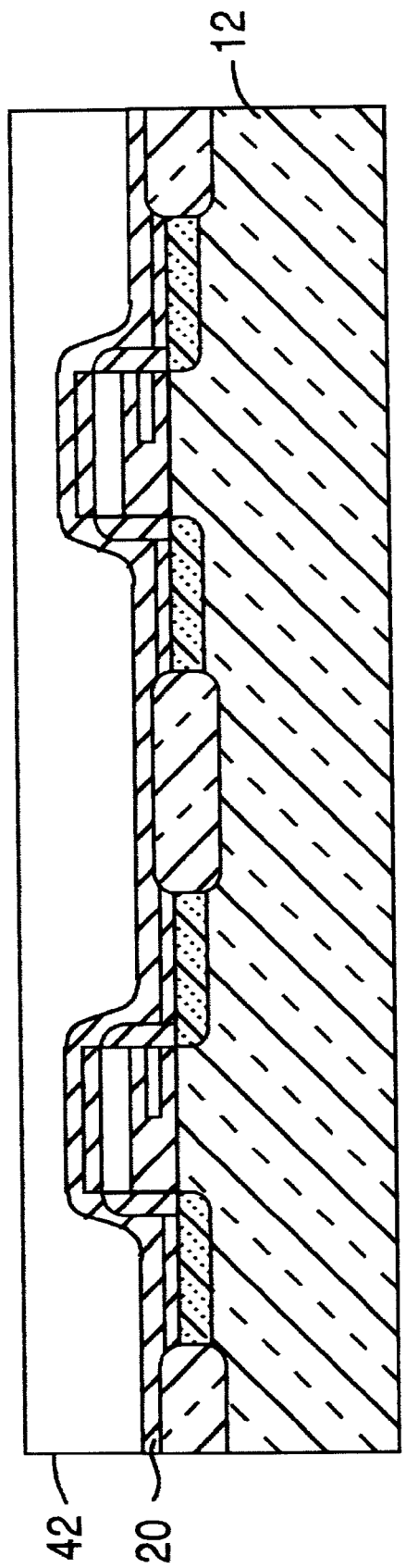

Referring now to FIG. 4, the next step of the process is to form an inter level dielectric insulator layer (ILD) 42', preferably of tetraethylorthosilicate (TEOS) glass, over the etch stop layer 20. Although illustrated as being a single layer, the TEOS layer 42' can include two or more sublayers, for example, a TEOS sublayer formed over a borophosphotetraethylorthosilicate (BPTEOS) sublayer. The TEOS layer 42' is planarized as illustrated in FIG. 5 using, preferably, chemical-mechanical polishing (CMP), and redesignated as 42.

Figure 6:
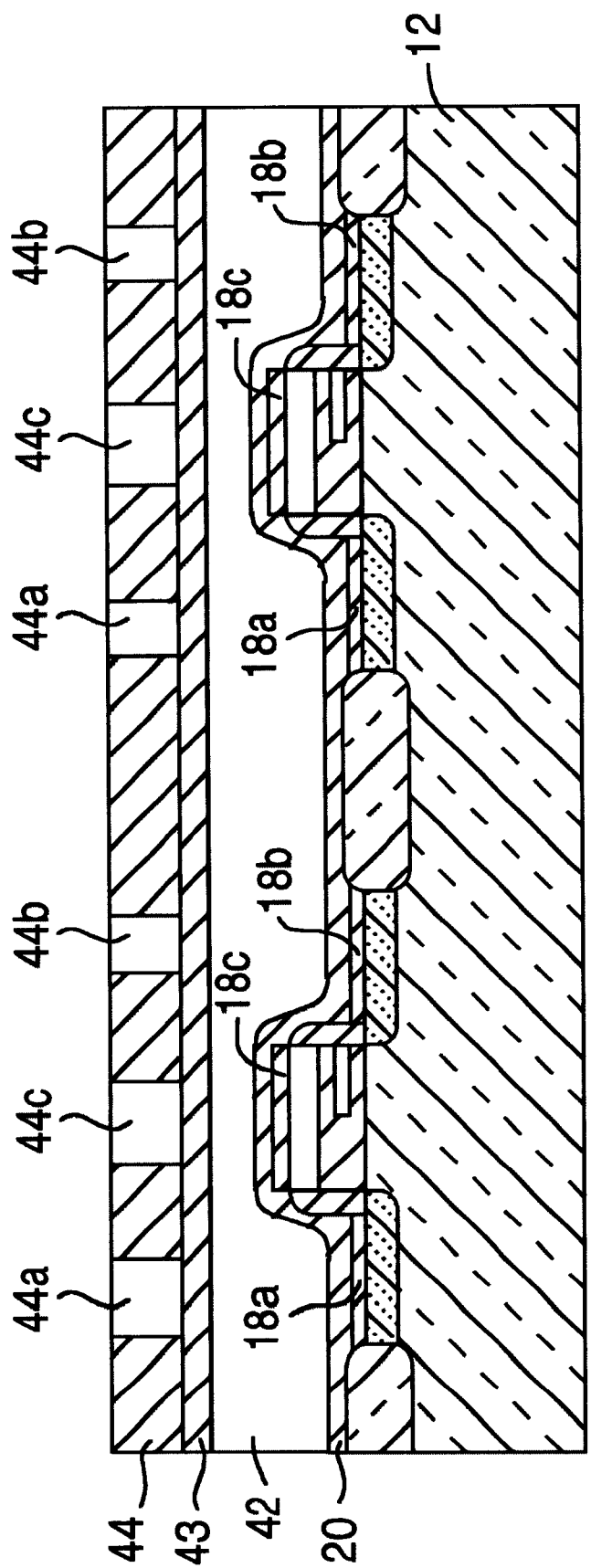

The remaining steps result in the formation of a tungsten damascene local interconnect structure for the memory 10. In FIG. 6, an antireflection layer 43 is formed over the insulator layer 42, and a layer of photoresist 44 is formed over the antireflection layer 43. The antireflection layer 43 is preferably, but not necessarily, formed of the same material as the etch stop layer 20, more specifically silicon nitride ($Si_3N_4$), silicon oxynitride (SiON:H) and silicon oxime (SiNO:H).

The photoresist layer 44 is patterned using photolithography such that first holes 44a, 44b and 44c are formed above the silicide interconnect areas 18a, 18b and 18c respectively. The antireflection layer 43 inhibits adverse reflections during exposure of the photoresist layer 44 in the photolithography process.

Figure 7:
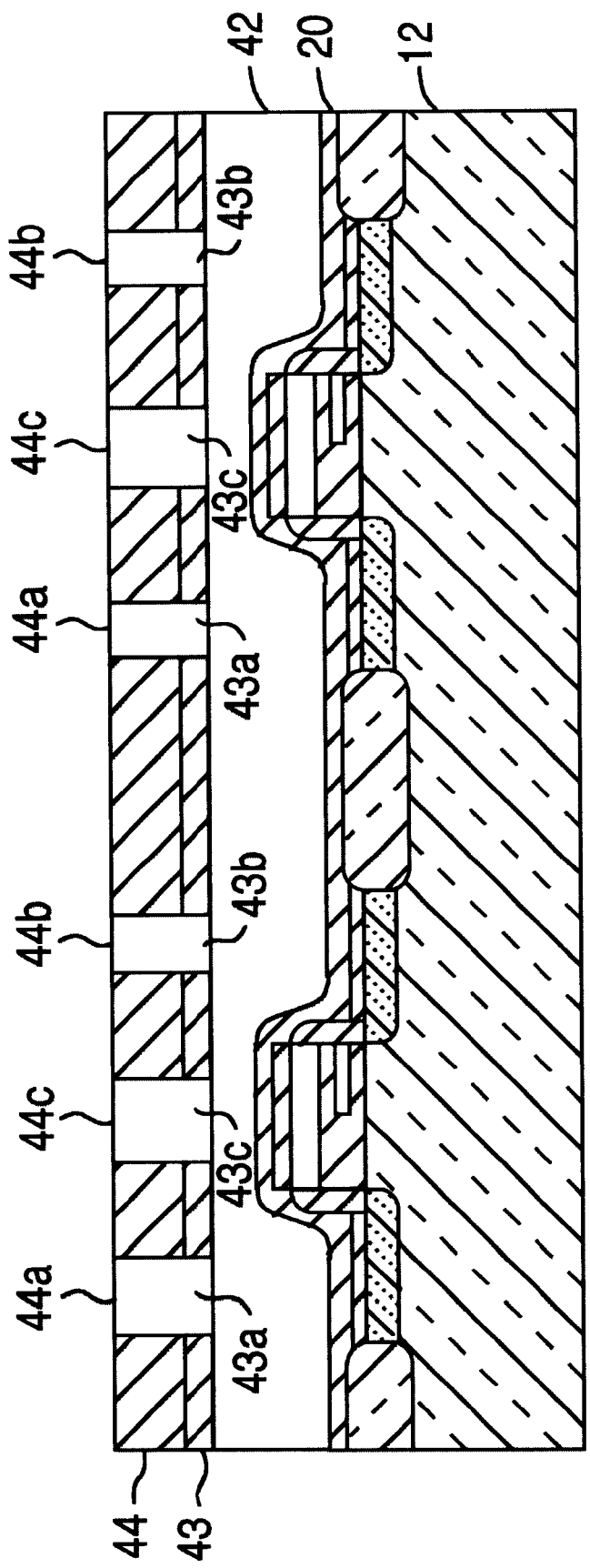
Figure 8:
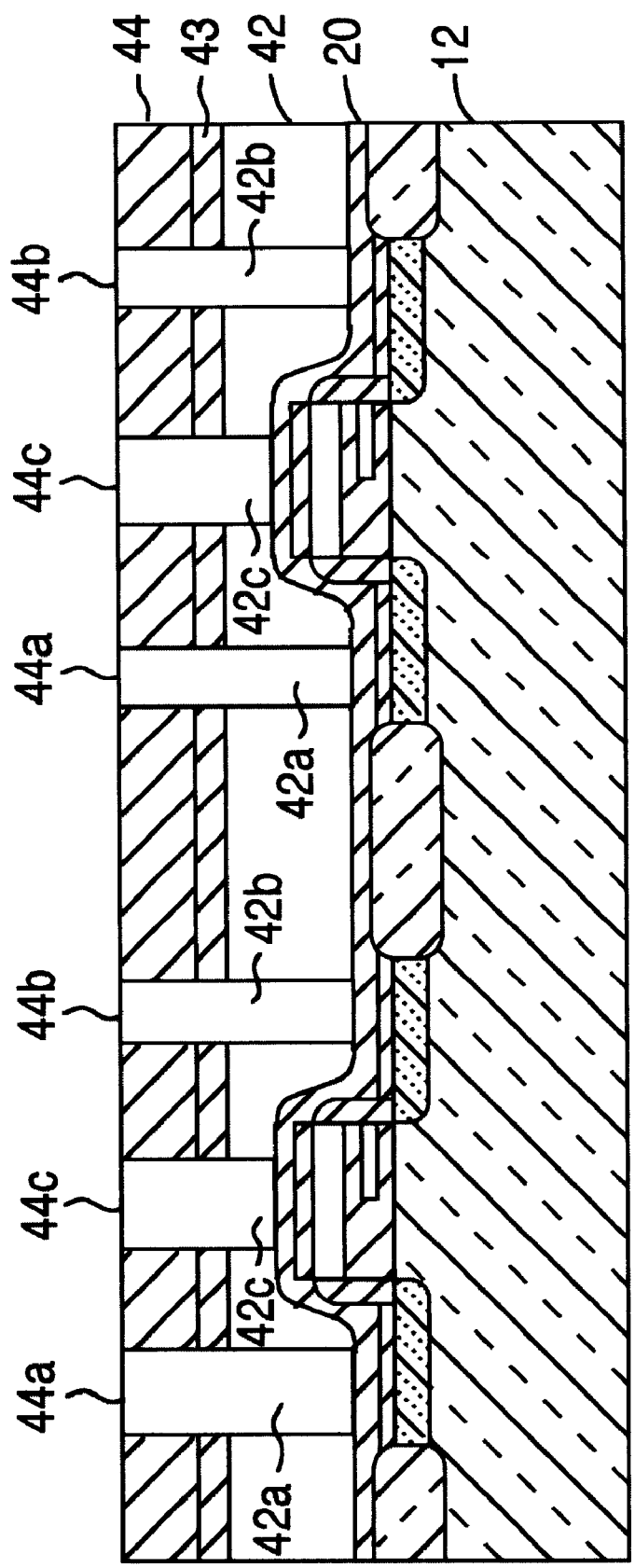

In FIGS. 7 and 8, holes are etched through the antireflection layer 43 and TEOS layer 42 down to the etch stop layer 20, preferably using a two stage Reactive Ion Etching (RIE) process.

In FIG. 7, second holes 43a, 43b and 43c are etched through the antireflection layer 43 using the photoresist layer 44 as a mask. The etchant is preferably fluoromethane ($CH_3F$), $CH_3F/Ar/O_2$, $CH_2F_2$, or $CH_2F_2/Ar/O_2$, which has a selectively high etch rate for nitride and a low etch rate for TEOS.

In FIG. 8, the insulator layer 42 is etched down to the etch stop layer 20 using RIE with an octofluorobutene ($C_4F_8$), $C_4F_8/O_2/Ar$, $C_4F_8/CO/Ar$, $C_5F_8/O_2/Ar$, or $C_5F_8/CO/Ar$ etchant which has a high etch rate for TEOS and a low etch rate for nitride to form third holes 42a, 42b and 42c through the TEOS insulator layer 42.

Figure 9:
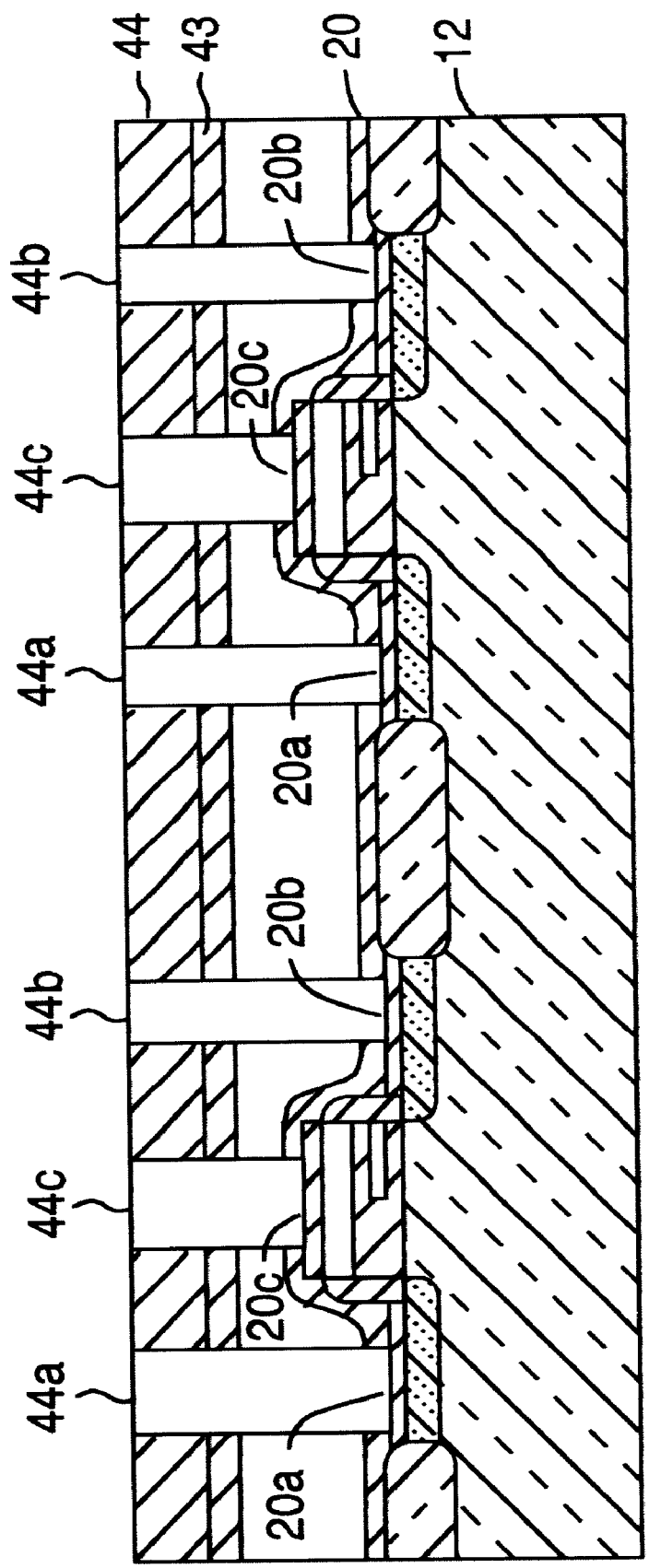
FIGS. 9 to 13 are simplified sectional views illustrating additional processing steps as performed in the prior art.

The following description with reference to FIGS. 9 to 13 relates to the prior art method of completing the fabrication process through the tungsten damascene steps. In FIG. 9, RIE is used with fluoromethane ($CH_3F$) etchant to remove the portions of the etch stop layer 20 underlying the holes 44a, 44b and 44c in the photoresist layer 44. The result is the formation of fourth holes 20a, 20b and 20c through the etch stop layer 20.

Figure 10:
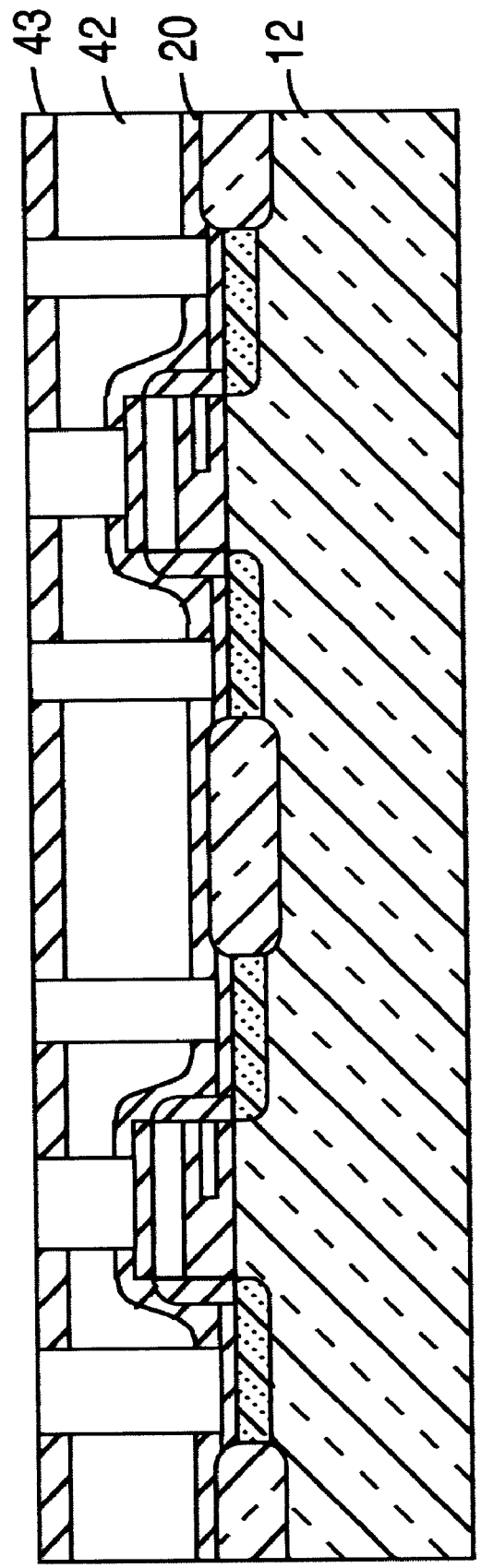
Figure 11:
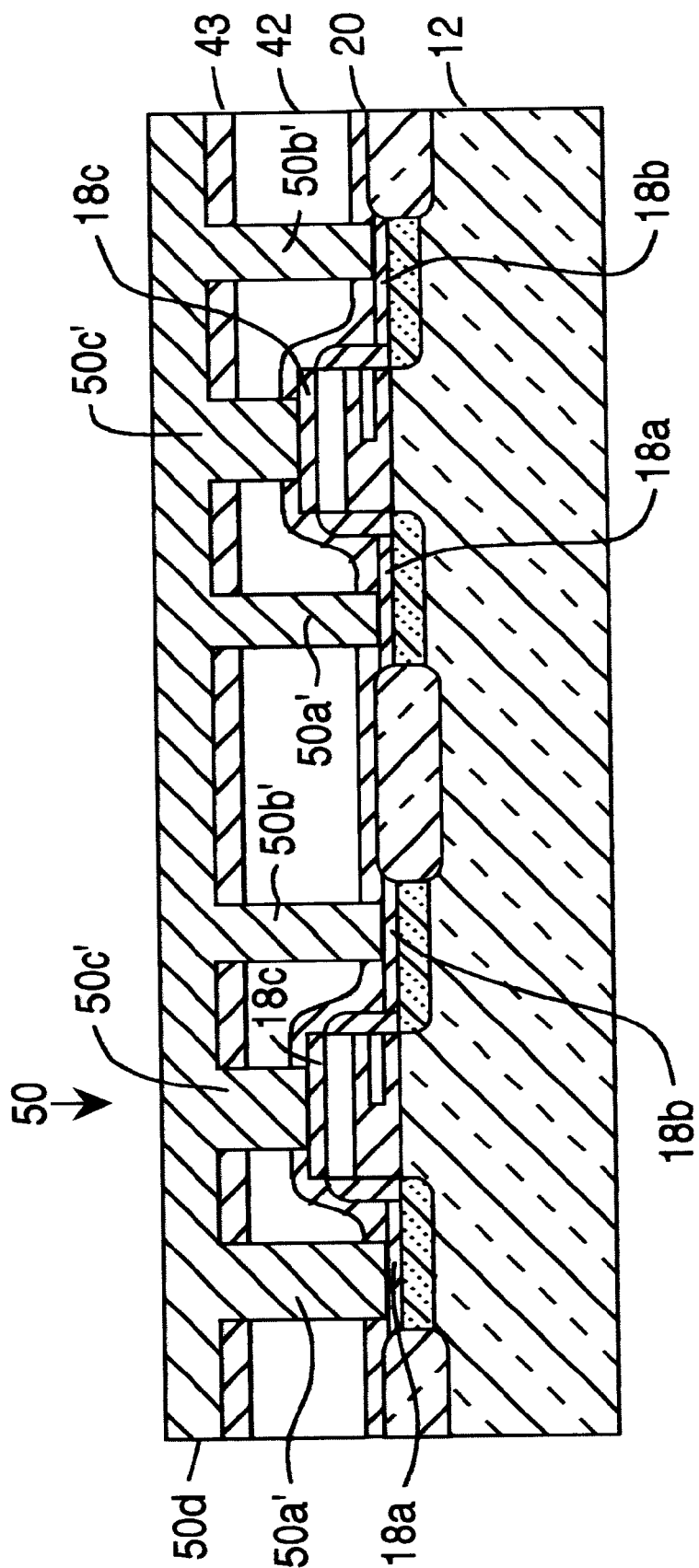

Then, the structure is removed from the RIE chamber to perform the following operations ex-situ. In FIG. 10, the photoresist layer 44 is removed using conventional $0_2$ ashing. In FIG. 11, tungsten 50 is deposited over the structure of FIG. 10. The tungsten 50 fills the holes through the antireflection layer 43, TEOS insulator layer 42 and etch stop layer 20 as indicated at 50a', 50b'and 50c', and ohmically contacts the interconnect areas 18a, 18b and 18c respectively. The tungsten 50 further forms on the top of the antireflection layer 43 as indicated at 50d.

Figure 12:
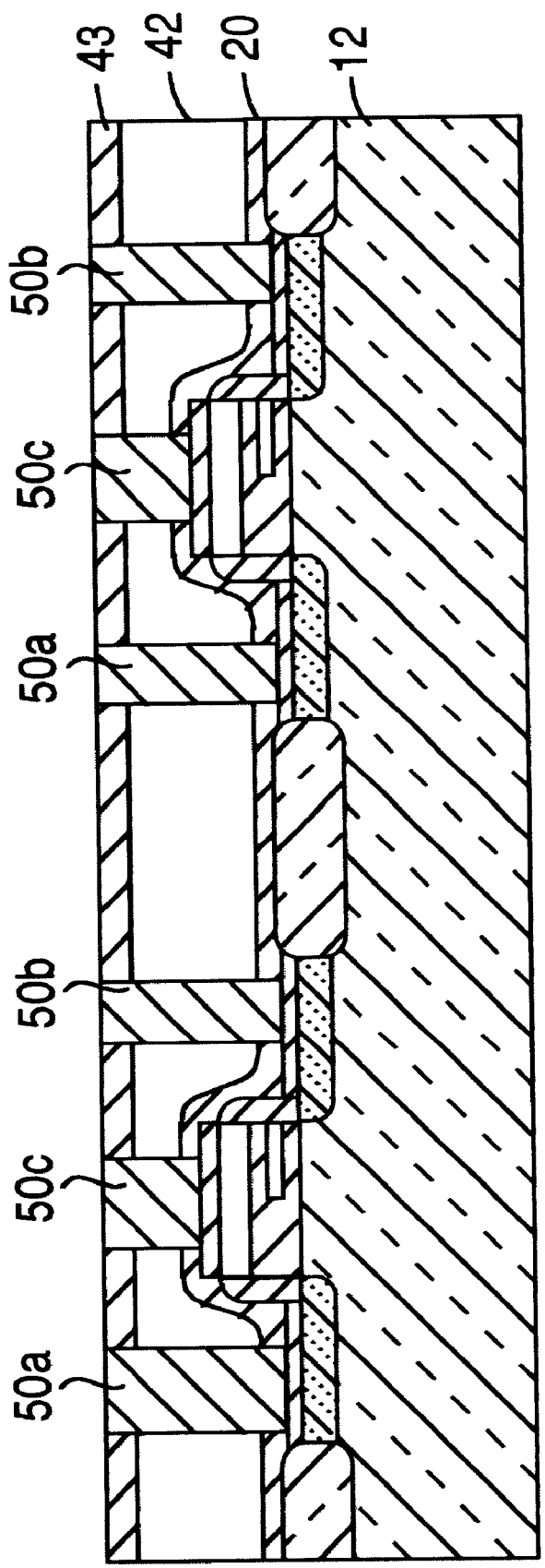
Figure 13:
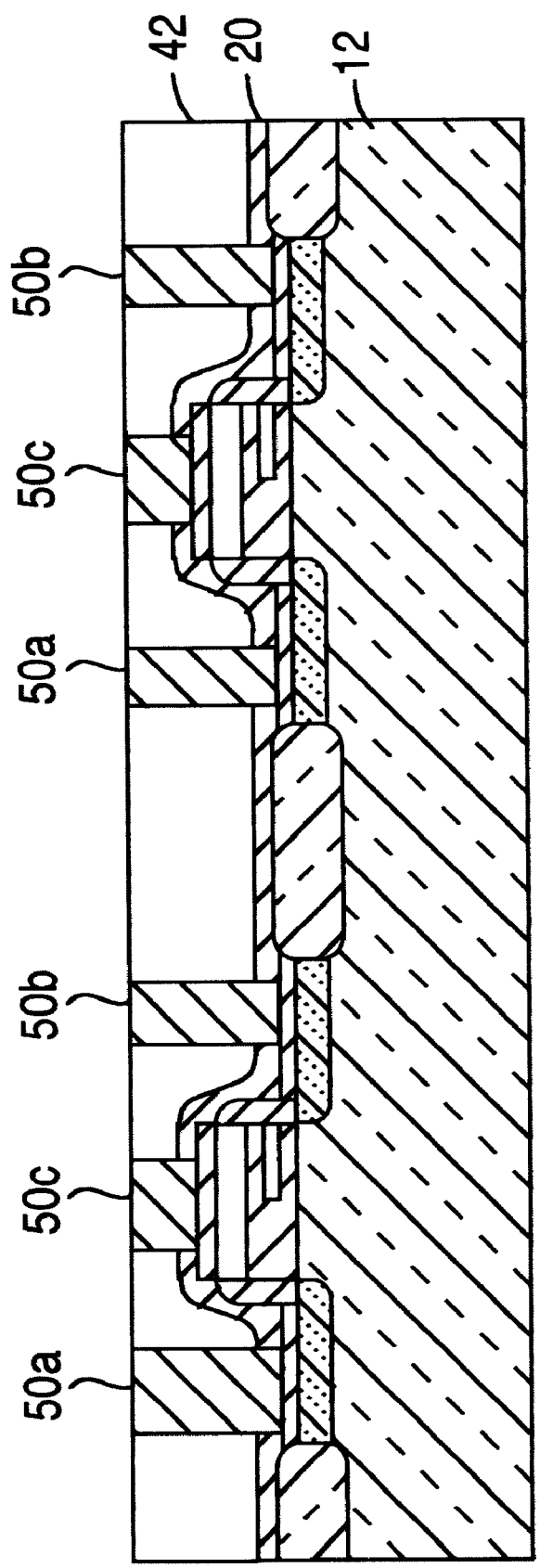

In FIG. 12, the top of the structure is polished or planarized, preferably using chemical-mechanical polishing, to remove the tungsten 50d from the antireflection layer 43. In FIG. 13, the antireflection layer 43 is removed using an oxide buff, which is also a chemical-mechanical polishing technique.

The result is independent local interconnects 50a, 50b and 50c which are formed of tungsten inlaid in the holes through the TEOS layer 42 and the etch stop layer 20. The local interconnects 50a, 50b and 50c enable the sources 14a, drains 14b, and control gates 14e respectively of the transistor devices 14 to be electrically accessed from the upper surface of the structure.

The prior art process steps described above with reference to FIGS. 9 to 13 are disadvantageous for several reasons. Firstly, they cannot be performed in-situ, and several types of apparatus must be employed to perform the various steps. The process includes a relatively large number of steps, some which could be advantageously omitted. These include the ex-situ photoresist ashing step and the oxide buff step to remove the antireflection layer 43. In addition, the oxide buff step results in non-uniformity of the underlying insulator layer 42 which must be dealt with in subsequent processing.

These drawbacks of the prior art are eliminated in accordance with the present invention as illustrated in FIGS. 14 to 17, in which like elements are designated by the same reference numerals used in the preceding figures.

Figure 14:
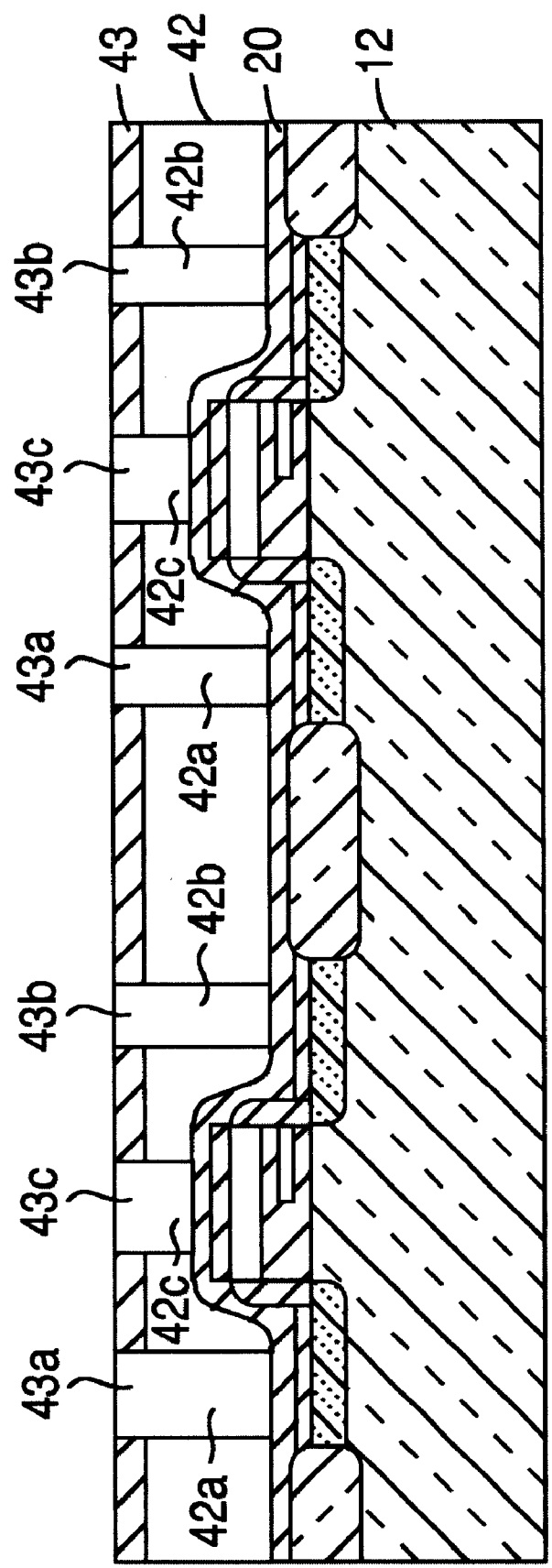
FIGS. 14 to 17 are simplified sectional views illustrating additional processing steps as performed in accordance with the present invention that produce the same structure as steps 10 to 13 in an improved manner.
Figure 15:
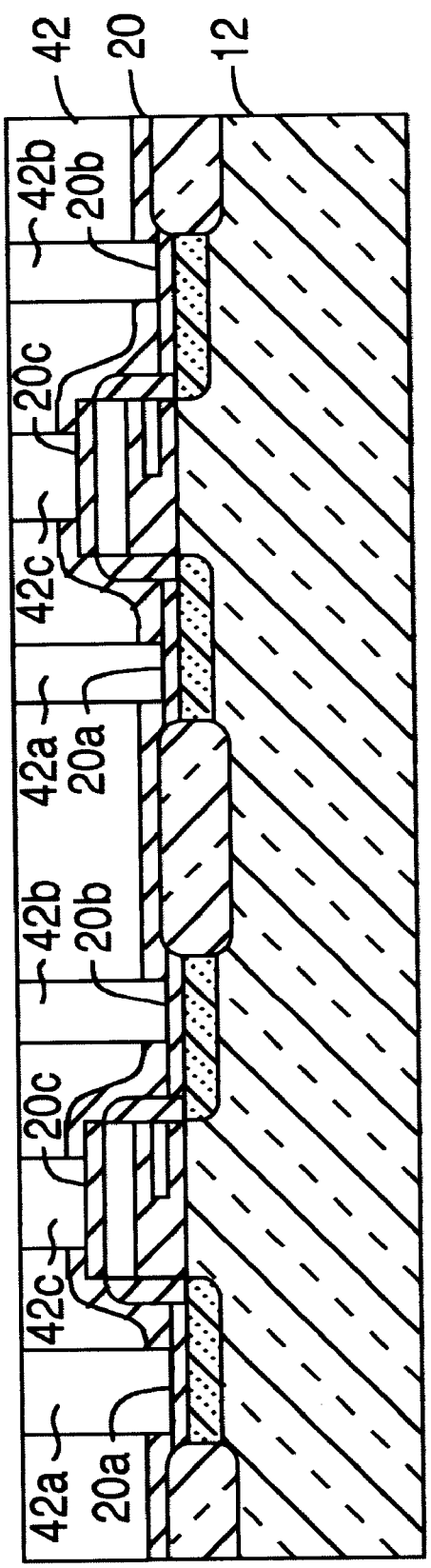

The entire process in accordance with the present invention, with the exception of the tungsten interconnect formation, is performed in-situ in one RIE chamber. In the step of FIG. 14, $0_2$ ashing is performed to remove the photoresist layer 44. In FIG. 15, the antireflection layer 43 and the portions of the etch stop layer 20 underlying the holes 42a, 42b and 42c in the insulator layer 42 are removed simultaneously using RIE with a fluoromethane ($CH_3F$) or $CH_3F/O_2$ etchant. This results in the formation of the fourth holes 20a, 20b and 20c through the etch stop layer.

Figure 16:
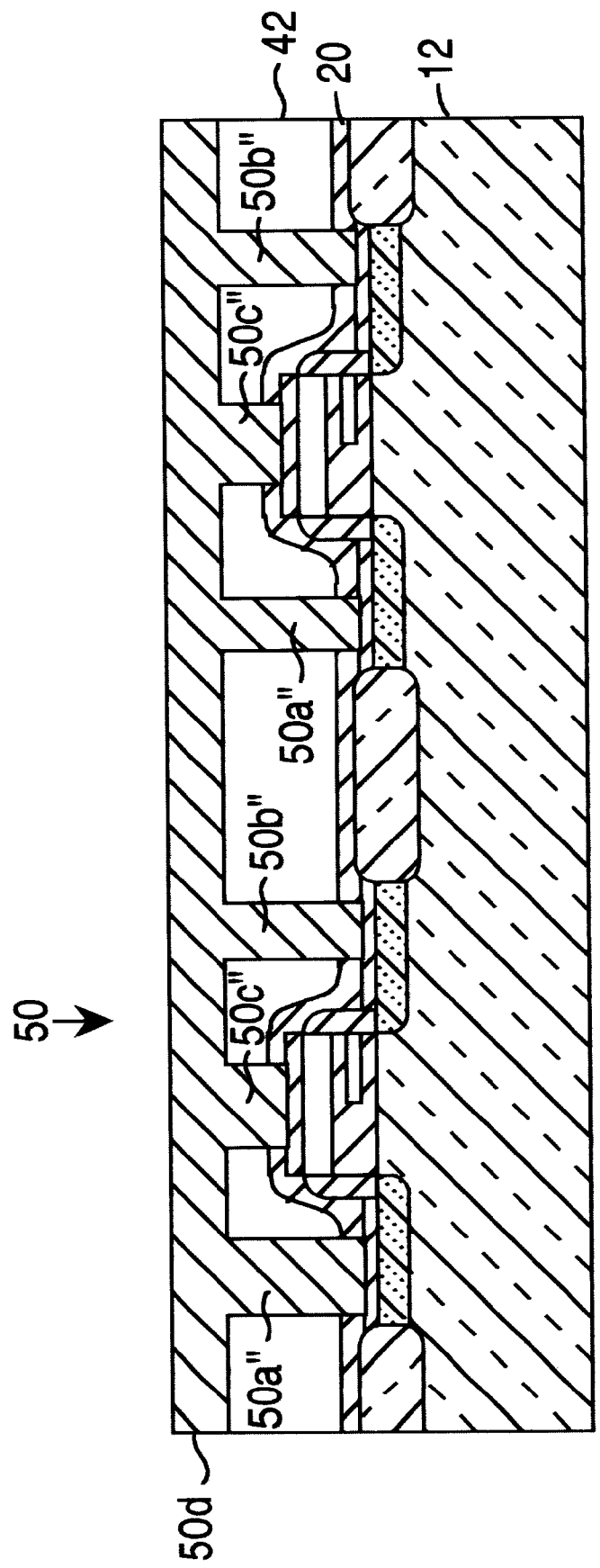

In FIG. 16, the structure is removed from the RIE chamber, and tungsten 50 is deposited over the structure of FIG. 15. The tungsten fills the holes through the TEOS insulator layer 42 and etch stop layer 20 as indicated at 50a", 50b" and 50c", and ohmically contacts the interconnect areas 18a, 18b and 18c respectively. The tungsten 50 further forms on the top of the insulator layer 42 as indicated at 50d.

Figure 17:
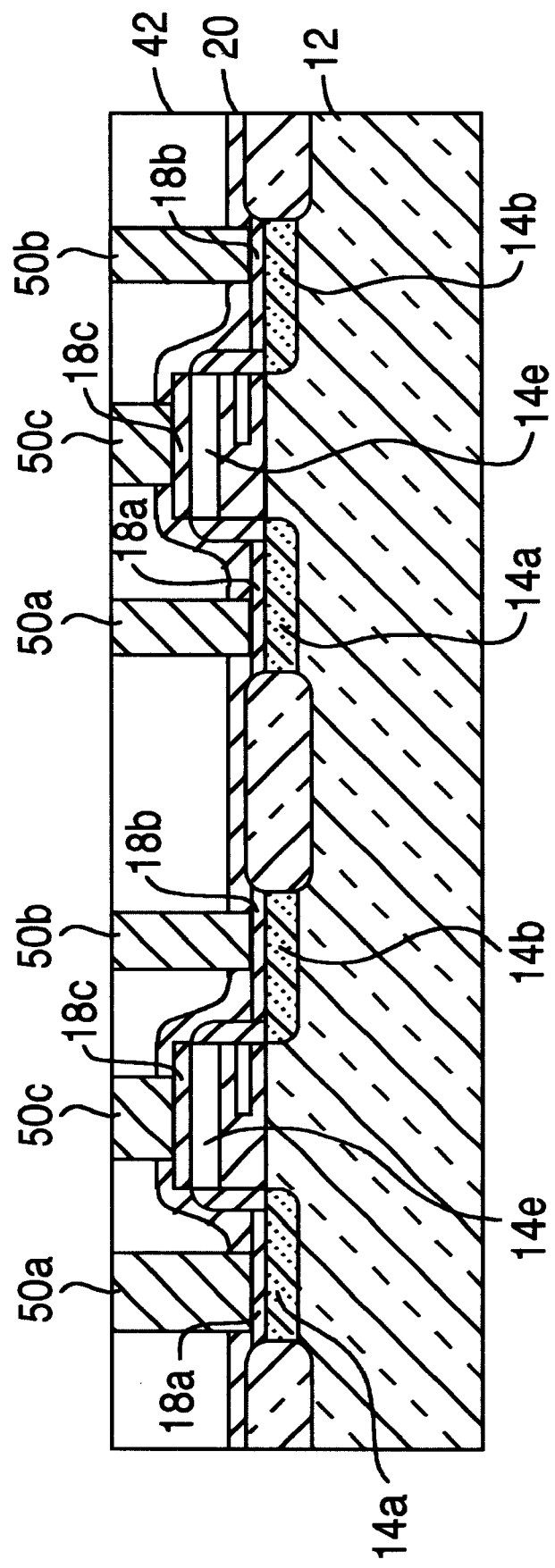

In FIG. 17, the top of the structure is polished or planarized, preferably using chemical-mechanical polishing, to remove the tungsten 50d from the insulator layer 42.

The result is independent local interconnects 50a, 50b and 50c which are formed of tungsten inlaid in the holes through the TEOS layer 42 and the etch stop layer 20 and ohmically contact the local interconnect areas 18a,18b,18c. The local interconnects 50a, 50b and 50c enable the sources 14a, drains 14b, and control gates 14e respectively of the transistors 14 to be electrically accessed from the upper surface of the structure.

The structure illustrated in FIG. 17 is essentially similar to that produced by the prior art as illustrated in FIG. 13. However, the present process produced the structure using two less process steps, and further produced the structure in-situ in a single RIE chamber. More specifically, the present invention eliminates the ex-situ photoresist ashing step and the oxide buff step to remove the antireflection layer 43. As such, the present invention constitutes a substantial improvement over the prior art.

Various modifications will become possible for those skilled in the art after receiving the teachings of the present disclosure without departing from the scope thereof.

We claim:

1. A method of performing in-situ, single step removal of an anti-reflective coating layer and an etch stop layer in the fabrication of a semiconductor structure, said method comprising the steps of:

a) providing a semiconductor substrate;

b) forming a semiconductor device having an interconnect area disposed on a top surface of said semiconductor substrate;

c) depositing an etch stop layer disposed on top of said semiconductor substrate and said semiconductor device, said etch stop layer is a material selected from the group consisting of silicon nitride, silicon oxynitride, and silicon oxime;

d) depositing an insulating layer disposed on top of said etch stop layer; said insulating layer being comprised of tetraethylorthosilicate (TEOS) glass;

e) depositing an anti-reflective coating layer disposed on top of said insulating layer, said anti-reflective coating layer is a material selected from the group consisting of silicon nitride, silicon oxynitride, and silicon oxime;

f) depositing a photoresist layer disposed on top of said antireflective coating layer;

g) patterning said photoresist layer using photolithographic techniques to form a hole through said photoresist layer which overlies said semiconductor device;

h) extending said hole through said anti-reflective coating layer using fluoromethane in a two stage reactive ion etching process;

i) extending said hole through said insulating layer using octofluorobutane in a two stage reactive ion etching process;

j) removing said photoresist layer; and k) removing simultaneously remaining portions of said anti reflective coating layer and portions of said etch stop layer underlying said hole using fluoromethane, wherein said semiconductor substrate, said semiconductor device, and portions of said etch stop layer remain.

2. The method of performing in-situ, single step removal of an anti-reflective coating layer and an etch stop layer in the fabrication of a semiconductor structure as recited in claim 1, said method further comprising the step of:

filling said hole with an electrically conductive material which contacts said interconnect area on said semiconductor substrate to form a local interconnect.

3. The method of performing in-situ, single step removal of an anti-reflective coating layer and an etch stop layer in the fabrication of a semiconductor structure as recited in claim 2, wherein said electrically conductive material is tungsten.

4. The method of performing in-situ, single step removal of an anti-reflective coating layer and an etch stop layer in the fabrication of a semiconductor structure as recited in claim 1, wherein step b) further comprises:

b1) forming a layer of a refractory metal silicide material over a silicon layer which forms part of said interconnect area; and b2) reacting the silicide material with said underlying silicon layer to form a silicide interconnect area.

5. The method of performing in-situ, single step removal of an anti-reflective coating layer and an etch stop layer in the fabrication of a semiconductor structure as recited in claim 1, wherein steps h), i), and k) are performed using a Reactive Ion Etching (RIE) process.

* * * * *